US010237970B2

(12) United States Patent
Salter et al.

(10) Patent No.: US 10,237,970 B2
(45) Date of Patent: Mar. 19, 2019

(54) BENDING METHOD FOR PRINTED CIRCUIT BOARD

(71) Applicant: FORD GLOBAL TECHNOLOGIES, LLC, Dearborn, MI (US)

(72) Inventors: Stuart C. Salter, White Lake, MI (US); James J. Surman, Clinton Township, MI (US); Todd Jared Konet, Canton, MI (US)

(73) Assignee: FORD GLOBAL TECHNOLOGIES, LLC, Dearborn, MI (US)

(*) Notice: Subject to any disclaimer, the term of this patent is extended or adjusted under 35 U.S.C. 154(b) by 63 days.

(21) Appl. No.: 15/434,176

(22) Filed: Feb. 16, 2017

(65) Prior Publication Data
US 2018/0235082 A1    Aug. 16, 2018

(51) Int. Cl.
H05K 1/02    (2006.01)
H05K 1/11    (2006.01)
H05K 3/34    (2006.01)
H05K 3/00    (2006.01)
H01R 43/02   (2006.01)

(52) U.S. Cl.
CPC ....... H05K 1/0278 (2013.01); H01R 43/0256 (2013.01); H05K 1/111 (2013.01); H05K 3/0044 (2013.01); H05K 3/34 (2013.01); H05K 2203/107 (2013.01)

(58) Field of Classification Search
CPC .... F21S 4/00; F21S 4/24; H01L 25/04; H01L 33/64; H05K 1/02; H05K 7/20; H05K 1/0278; H05K 1/111; H05K 3/0044; H05K 3/34; H05K 2203/107; H01R 43/0256
See application file for complete search history.

(56) References Cited

U.S. PATENT DOCUMENTS

| 5,434,362 | A  | 7/1995  | Klosowiak et al. |
| 6,705,005 | B1 | 3/2004  | Blazier et al. |
| 7,615,860 | B2 | 11/2009 | Su et al. |
| 9,006,579 | B2 | 4/2015  | Inaba et al. |
| 2010/0270923 | A1 | 10/2010 | Froehlich et al. |

FOREIGN PATENT DOCUMENTS

| CN | 205408267 U      |   | 7/2016 |
| JP | 8096548 A        | * | 4/1996 |
| WO | 2010060417 A1    | * | 6/2010 |
| WO | 2014076233 A1    |   | 5/2014 |
| WO | 2016074792 A1    |   | 5/2016 |

OTHER PUBLICATIONS

Häusermann website, 3D-PCBs, Printed Circuit Boards, Application-specific PCBs (<<http://ww.haeusermann.at/en/printed-circuit-boards/application-specific-pcbs/3d-pcbs>>), retrieved Feb. 15, 2017.

* cited by examiner

Primary Examiner — Carl Arbes
(74) Attorney, Agent, or Firm — Marla Johnston; Brooks Kushman, P.C.

(57) ABSTRACT

A bendable printed circuit board is provided. The bendable circuit board may include a circuit board having first and second sections and at least one plated wire that electrically connects and mechanically joins the first and second sections together. The first section may be pivotable with respect to the second section through the at least one plated wire.

12 Claims, 3 Drawing Sheets

US 10,237,970 B2

BENDING METHOD FOR PRINTED CIRCUIT BOARD

TECHNICAL FIELD

The present disclosure relates to a printed circuit board for a vehicle and a method for making the same.

BACKGROUND

A printed circuit board (PCB) mechanically supports and electrically connects electronic components using conductive tracks, pads or other features laminated within a non-conductive substrate. When more than one PCB is used in an application, e.g., an overhead LED light or other interior lighting component, the PCBs are often connected by a harness or other circuitry at an additional cost.

SUMMARY

According to one embodiment of this disclosure, a bendable printed circuit board is provided. The bendable circuit board may include a circuit board having first and second sections and at least one plated wire that electrically connects and mechanically joins the first and second sections together. The first section may be pivotable with respect to the second section through the at least one plated wire.

According to another embodiment of this disclosure, a method of making a bendable printed circuit board is provided. The method may include removing a predetermined amount of substrate within a circuit board to define a weakened portion dividing the circuit board into a first and second section. The method may include placing a plated wire, on the at least one solder pad on each of the sections and soldering the plated wire to the at least one solder pad on each of the sections.

According to yet another embodiment of this disclosure, a method of making a bendable printed circuit board is provided. The method may include removing a predetermined amount of substrate within a circuit board to define a weakened portion dividing the circuit board into a first and second section. The method may also include placing a plated wire on at least one solder pad disposed on each of the sections and soldering the plated wire to the at least solder pad.

DETAILED DESCRIPTION

Figure 1:
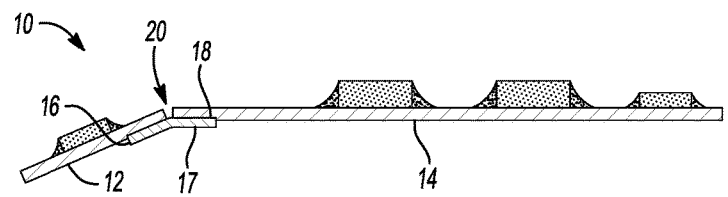
FIG. 1 illustrates a partial cross section of a printed circuit board according to at least one embodiment.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

A printed circuit board (PCB) mechanically supports and electrically connects electronic components using conductive tracks, pads or other features laminated within a non-conductive substrate. In some instances, it may be desirable to use a conventional low cost rigid PCB that includes various sections placed at varying angles within certain devices. For instance, an overhead lighting device may include two or more light emitting diodes (LED) lights, each requiring a connection to a power source. The LEDs are often angled in various directions to provide an even distribution of light to certain portions of the vehicle cabin. Previously, rather than constructing multiple light sources at different angles, complex and thickly shaped optics were used to angle and distribute the light. But these optics may add significant material and assembly costs. Moreover, the use of additional optics generally increases the thickness of the lamp and reduces visibility. Because certain applications require multiple LEDs, each having a unique orientation, multiple PCBs connected by a wire harness or other circuitry is required. The use of additional PCBs, wire harnesses and circuits may add significant material and labor costs. Moreover, additional components may lead to a decrease in quality and an increase in reliability issues.

The inventors provide an approach to at least partially address one or more of the above issues recognized by the inventors. The present disclosure relates to a printed circuit board including one or more sections, that may be disposed in a variety of positions and a method of making the same. By making a single PCB with simple connections that allow for positioning certain sections of the PCB at various angles, additional costs and complexity associated with using two or more PCBs is avoided. Moreover, the use of one PCB as opposed to multiple components may result in higher quality and increased reliability. Providing a PCB with at least two portions, which are separated by a weakened portion of the PCB substrate, and electrically connecting the two portions by a bendable electrical interconnect or wire allows one of the portions of the substrate to be angled with respect to the other section(s). The weakened portion of the PCB substrate may be weakened by a variety of methods, including but not limited to, scoring or perforating the PCB substrate on one or both sides, drilling a series of small holes through the PCB substrate, running a "V" shaped roller on either the top or bottom, or both sides of the PCB substrate, and forming the PCB substrate with small tabs, intended to be broken by hand during assembly.

The two portions of the PCB substrate may be electrically connected by a ductile electrical wire. Alternatively, the two portions may be connected by one or more wires of various lengths. The electrical wires may be soldered to the PCBs using various methods, including but not limited to using a plated wire or solder paste and soldering the wires to the PCB with hot bar solder, hand solder, laser soldering, or using a conventional reflow oven. Hot bar reflow soldering, also known as pulsed heat thermode soldering is a joining method where two pre-tinned parts are heated to the melting point of the tin. This process results in a permanent electro-mechanical joint. In contrast to hot bar reflow soldering to conventional soldering, laser soldering uses a laser to illuminate a soldering point. The area illuminated by the laser emits heat that transfers to the surrounding area until a melting temperature is reached.

Figure 2:
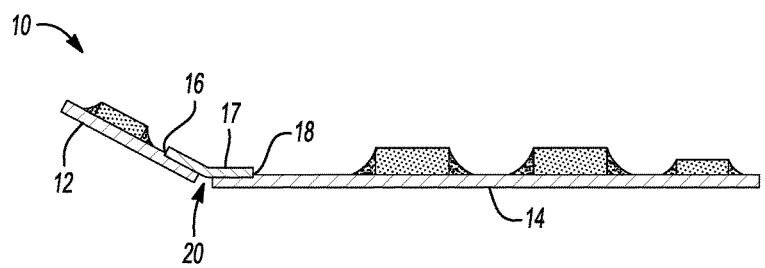
FIG. 2 illustrates a partial cross section of a printed circuit board according to at least one embodiment.

Referring to FIGS. 1 and 2, a partial cross section of a circuit board according to one or more embodiments are disclosed. The circuit board 10 includes a first section 12 and a second section 14 disposed on either side of weakened or separated section 20. The first and second sections 12 14 may be made of a non-conductive material, such as fiber glass or plastic that make up a substrate board. A copper layer may be etched within the board between the layers of non-conductive material. The weakened or separated section 20 may be produced by various methods. Those methods may include without limitation; scoring a groove on one side or both sides of the board, drilling a series of small holes within the board, applying a "V-shaped" roller across on side or both sides of the board, removing segments of material with a router to define a plurality of remaining sections of material between the first and second sections.

A plated wire 17 has a first end 16 and a second end 18 attached to the first and second sections 12 14, respectively. The plated wire may be plated with a number of electrically conductive materials including but not limited to platinum, silver, iron, copper, aluminum, or gold. The wire has sufficient ductility and strength to facilitate bending or pivoting either first or second sections to a desired position. Referring specifically to FIG. 1, the first section is angled in a negative direction with respect to the second section. Referring to specifically to FIG. 2, the first section is angled in a positive direction with respect to the second section. The plated wire may be tinned or plated with another suitable alloy. Tinning or plating the plated wire facilitates soldering the wire to a solder pad.

Figure 3:
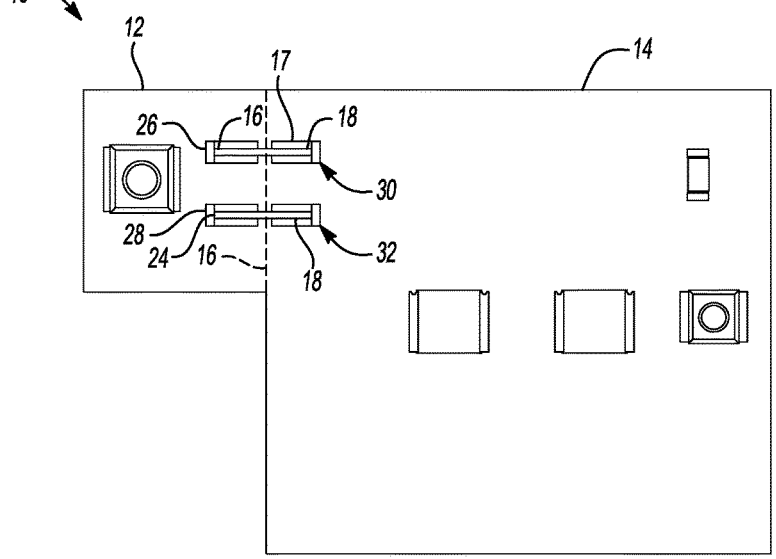
FIG. 3 illustrates a top view of a printed circuit board according to at least one embodiment.

Referring to FIG. 3, a top view of a circuit board according to one or more embodiments of this disclosure. The first section 12 and the second section 14 are bifurcated or divided along the weakened portion 20. The weakened portion may be positioned or oriented in a variety of ways. The first section 12 includes two solder pads 26 28 attached to the substrate of the first section. The second section 14 also includes two solder pads 30 32 attached to the substrate of the second section. Depending on the size of the circuit board and the number of required electrical connections, each section may include more or less solder pads. As mentioned above, the plated wires 17 include first and second ends 16 18 that are soldered to the solder pads. Each end 16 18 may be soldered by a variety of methods including but not limited to reflow soldering within a reflow oven, hot bar soldering, hand soldering and LASER soldering.

Figure 4:
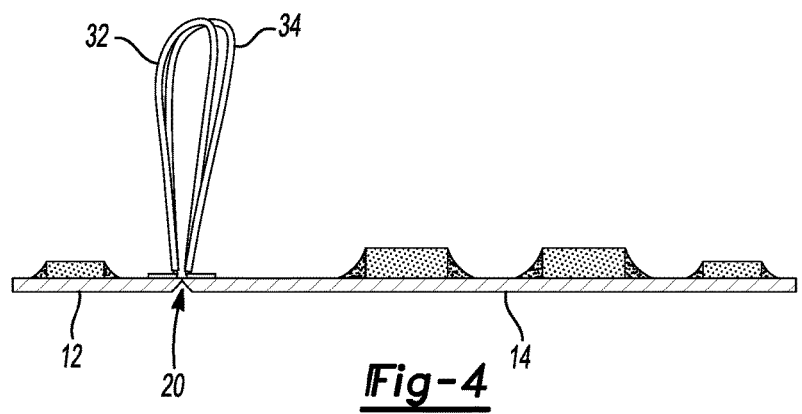
FIG. 4 illustrates a partial cross section of a printed circuit board according to at least one embodiment.

Referring to FIG. 4, a partial cross section of a printed circuit board including longer wires is illustrated. The circuit board 10 includes a first section 12 and a second section 14 disposed on either side of weakened or separated section 20. The first and second sections 12 14 may be made of a non-conductive material, such as fiber glass or plastic that make up a substrate. A copper layer may be etched within the board between the layers of non-conductive material. The weakened or separated section 20 may be produced by various methods, as mentioned above in the discussion of FIGS. 1 and 2. Elongated insulated wires 32 34 are each soldered to their respective solder pads that are attached to the first section 12 and second section 14. The elongated wire may be plated with a number of electrically conductive materials including but not limited to platinum, silver, iron, copper, aluminum, or gold. The use of the elongated insulated wires facilitates separating the first section from the second section by a distance that corresponds to the length of the insulated wires 32 34.

Figure 5:
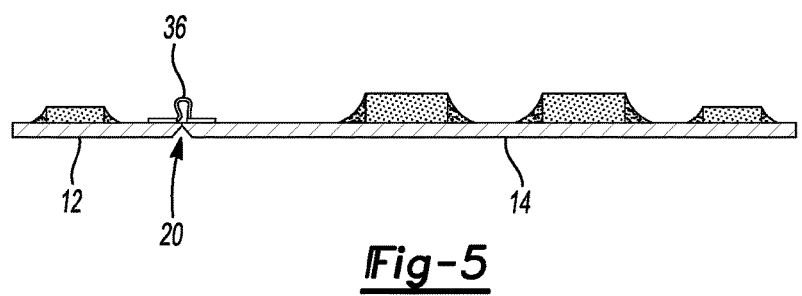
FIG. 5 illustrates a partial cross section of a printed circuit board according to at least one embodiment.

Referring to FIG. 5, a partial cross section of a printed circuit board including a shorter insulated wire is illustrated. The circuit board 10 includes a first section 12 and a second section 14 disposed on either side of weakened or separated section 20. The first and second sections 12 14 may be made of a non-conductive material, such as fiber glass or plastic that make up a substrate board. A copper layer may be etched within the board between the layers of non-conductive material. The weakened or separated section 20 may be produced by various methods, as mentioned above in the discussion of FIGS. 1 and 2. The shorter insulated wires 36 are each soldered to their respective solder pads that are attached to the first section 12 and second section 14. The use of shorter insulated wires facilitates separating the first section from the second section by a distance that corresponds to the length of the insulated wires 36.

Figure 6:
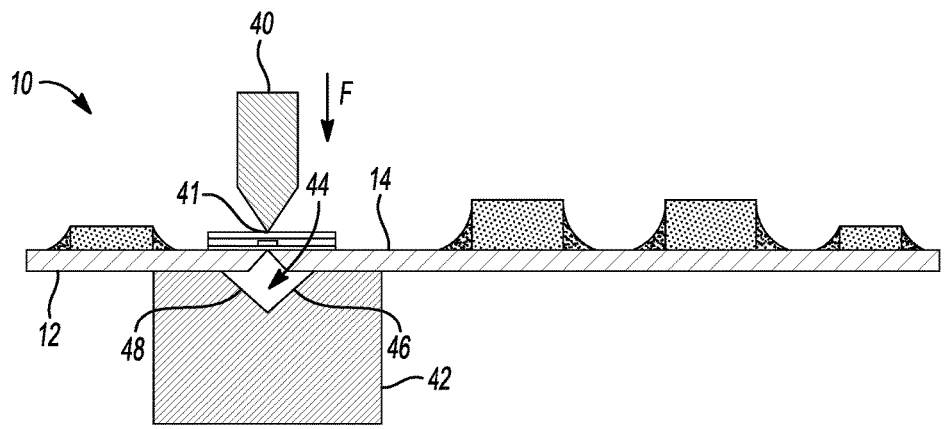
FIG. 6 illustrates a partial cross section of bending or breaking a printed circuit board according to at least one embodiment.

Referring to FIG. 6, a partial cross section of a printed circuit board disposed between an apparatus for bending or separating the printed circuit board is illustrated. As mentioned above, the printed circuit board 10 includes first and second sections 12 and 14 divided by a weakened portion 20. The weakened portion 20 may be aligned with a top anvil 40 and a bottom anvil 42. The top anvil 40 may include an edge 41 that contacts the printed circuit board 10 as the top anvil exerts a force along the directional arrow F. The edge 41 of the top anvil 40 has a triangular shape but other shapes may be utilized, including but not limited to a semi-circle, a square or a rectangle. The bottom anvil 42 includes a recessed portion 44 that is defined by two angled sections 46 48. The angled sections 46 48 may correspond to the triangular shape of the edge 41 of the top anvil. Similar to the edge 41 of the top anvil 42, the recessed portion 44 may take the form of another suitable shape, including but not limited to a semi-circle, a square or a rectangle.

Figures 7, 8:
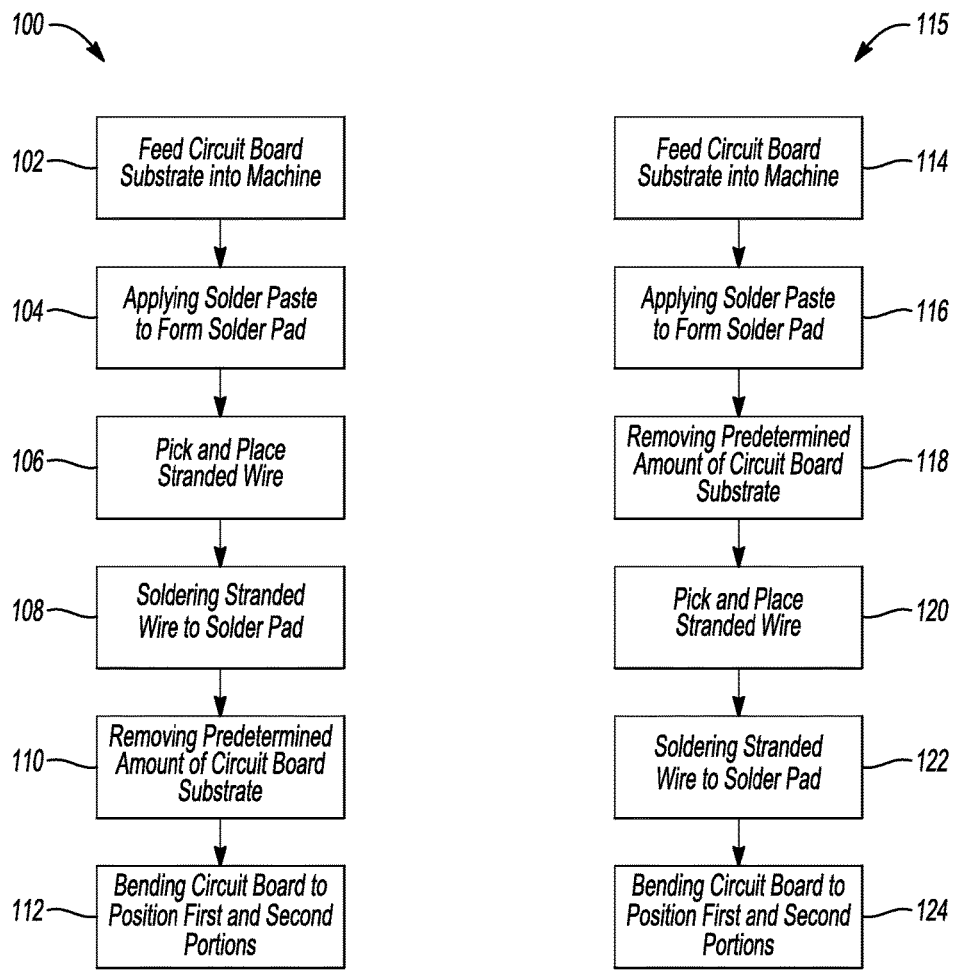
FIG. 7 illustrates a flow chart for a method of producing a printed circuit board according to least one embodiment.
FIG. 8 illustrates a flow chart for a method of producing a printed circuit board according to least one embodiment.

Referring to FIG. 7, a flow chart for a method for producing a printed circuit board according to at least one embodiment is illustrated. The method 100 begins at operation 102. In operation 102, a single piece circuit board substrate is fed into the machine or assembly line.

In operation 104, the solder pads 26 28 30 32 are formed by applying solder paste to the first and second sections 12 and 14. In operation 106, the machine picks up and places plated wire 17 on the solder pads 26 28 30 32. As mentioned above, the plated wire 17 may be a plated wire 17, an elongated wire 32 34, or a shorter wire 36.

In operation 108, the plated wire 17 are soldered to the soldered pads 26 28 30 32. The plated wire 17 may be soldered by a variety of methods, including but not limited to, reflow soldering within a reflow oven, hot bar soldering, hand soldering and LASER soldering.

In operation 110, the weakened portion 20 is formed by removing a predetermined amount of the circuit board substrate. The weakened portion may be created by a number of methods, including but not limited to, scoring a groove on one side or both sides of the board, drilling a series of small holes within the board, applying a "V-shaped" roller across on side or both sides of the board, removing segments of material with a router to define a plurality of remaining sections of material between the first and second sections.

In operation 112, one or both of the first and second sections 12 14 may be angled or positioned in a variety of configurations. Alternatively, the first and second sections 12 and 14 may be separated from each other by a distance that corresponds to the length of the plated wire 17. This operation may be accomplished by numerous methods, including but not limited to, using an upper and lower anvil 40 and 42, as illustrated in FIG. 6 or a hand brake.

Referring to FIG. 8, a flow chart for a method for producing the circuit board according another embodiment is illustrated. The method 115 begins at operation 116. In operation 116, a single piece circuit board substrate is fed into the machine or assembly line. In operation 118, the solder pads 26 28 30 32 are formed by applying solder paste to the first and second sections 12 and 14.

In operation 120, the weakened portion 20 is formed by removing a predetermined amount of the circuit board substrate. The weakened portion may be created by a number of methods, including but not limited to, scoring a groove on one side or both sides of the board, drilling a series of small holes within the board, applying a "V-shaped" roller across on side or both sides of the board, removing segments of material with a router to define a plurality of remaining sections of material between the first and second sections.

In operation 122, one or both of the first and second sections 12 14 may be angled or positioned in a variety of configurations. Alternatively, the first and second sections 12 and 14 may be separated from each other by a distance that corresponds to the length of the plated wire 17. This operation may be accomplished by numerous methods, including but not limited to, using an upper and lower anvil 40 and 42, as illustrated in FIG. 6 or a hand brake.

In operation 124, the machine picks up and places plated wires 17 on the solder pads 26 28 30 32. As mentioned above, the plated wire 17 may be an elongated wire 32 34, or a shorter wire 36. The plated wire 17 may be angled before they are picked up by the machine or operator. The angle may correspond to the angle defined by the first and second sections in operation 122.

In operation 126, the plated wires 17 are soldered to the soldered pads 26 28 30 32. The plated wire 17 may be soldered by a variety of methods, including but not limited to, reflow soldering within a reflow oven, hot bar soldering, hand soldering and LASER soldering.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method of making a bendable printed circuit board comprising:
    placing a plated wire, on at least one solder pad disposed on each of the sections;
    soldering the plated wire to the at least one solder pad on each of the sections; and
    after the soldering, removing a predetermined amount of substrate within a circuit board to define a weakened portion dividing the circuit board into a first and second section.

2. The method of claim 1, wherein the soldering step is accomplished by heating a portion of the plated wire and a portion of the soldering pad.

3. The method of claim 1, further comprising applying a force to either the first section or second section to bend the circuit board to a desired angle.

4. The method of claim 1, wherein the removing step is accomplished by applying a triangular cutting roller to at least one side of the circuit board.

5. The method of claim 1, wherein the removing step is accomplished by scoring at least one side of the circuit board.

6. The method of claim 1, further comprising separating the first and second sections of the circuit board by positioning the weakened portion of the circuit board above a bottom anvil and below a top anvil and displacing the top anvil towards the bottom anvil to break weakened portion without damaging the plated wire.

7. The method of claim 6, wherein the top anvil has a triangular tip and the bottom anvil has a recessed portion corresponding to the triangular tip of the top anvil and is configured to allow the circuit board to be displaced within the recessed portion until a desired angle between the first and second sections is achieved.

8. A method of producing an angled circuit board comprising:
    placing an elongated plated wire, on at least two solder pads attached to a circuit board substrate;
    soldering the plated wire to the at least one solder pad on each of the sections;
    after the soldering, removing a predetermined amount of substrate within a circuit board to define a weakened portion dividing the circuit board into a first and second section; and
    separating the first and second sections from one another.

9. The method of claim 8, further comprising applying a first and second solder pads to the circuit board substrate.

10. The method of claim 8, wherein the separating step is accomplished by applying a force to either the first or second section by a hand brake to separate the first and second sections from each other.

11. The method of claim 8, wherein soldering step is accomplished by directing a laser beam to the plated wire.

12. The method of claim 8, wherein the removing step is accomplished by routing a portion of the circuit board with a router.

* * * * *